(12) United States Patent
Otsuka

(10) Patent No.: US 7,085,181 B2
(45) Date of Patent: Aug. 1, 2006

(54) SEMICONDUCTOR DEVICE HAVING STORAGE CIRCUIT WHICH STORES DATA IN NONVOLATILE MANNER BY USING FUSE ELEMENT

(75) Inventor: Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 10/885,718

(22) Filed: Jul. 8, 2004

(65) Prior Publication Data

US 2005/0190636 A1 Sep. 1, 2005

(30) Foreign Application Priority Data

Feb. 26, 2004 (JP) ............................. 2004-051782

(51) Int. Cl.
*G11C 29/00* (2006.01)
(52) U.S. Cl. ..................................... 365/200; 365/225.7
(58) Field of Classification Search ........... 365/189.01, 365/189.02, 189.05, 200, 225.7, 230.02, 365/230.03, 230.06, 230.08
See application file for complete search history.

(56) References Cited

U.S. PATENT DOCUMENTS

| 5,835,425 | A  | * | 11/1998 | Berger ...................... 365/225.7 |
| 6,490,209 | B1 | * | 12/2002 | Vollrath et al. .......... 365/225.7 |
| 6,496,426 | B1 | * | 12/2002 | Jeon et al. ................ 365/225.7 |
| 6,621,751 | B1 | * | 9/2003  | Abedifard et al. ....... 365/225.7 |
| 6,646,932 | B1 | * | 11/2003 | Kato et al. ............. 365/230.06 |

FOREIGN PATENT DOCUMENTS

| JP | 2002-76126  | 3/2002  |
| JP | 2002-368096 | 12/2002 |

OTHER PUBLICATIONS

U.S. Appl. No. 11/191,973, filed Jul. 29, 2005, Otsuka.
U.S. Appl. No. 10/692,951, filed Oct. 27, 2003, Otsuka.

\* cited by examiner

*Primary Examiner*—Trong Phan
(74) *Attorney, Agent, or Firm*—Oblon, Spivak, McClelland, Maier & Neustadt, P.C.

(57) ABSTRACT

A semiconductor device includes a first fuse circuit group and a plurality of second fuse circuit groups. The first fuse circuit group, in which n-bit data is written, is electrically programmable. Each of the plurality of second fuse circuit groups has a first storage unit which is electrically programmable and stores m-bit (m is an integral submultiple of n) rewrite data, and a second storage unit which stores the address of a bit to be written in the first fuse circuit group.

12 Claims, 6 Drawing Sheets

SEMICONDUCTOR DEVICE HAVING STORAGE CIRCUIT WHICH STORES DATA IN NONVOLATILE MANNER BY USING FUSE ELEMENT

CROSS-REFERENCE TO RELATED APPLICATIONS

This application is based upon and claims the benefit of priority from prior Japanese Patent Application No. 2004-051782, filed Feb. 26, 2004, the entire contents of which are incorporated herein by reference.

BACKGROUND OF THE INVENTION

1. Field of the Invention

The present invention relates to a semiconductor device and, more particularly, to a semiconductor device having a storage circuit which stores, e.g., the security data of a digital product, code data, ID data unique to a chip, trimming data for timing adjustment or voltage regulation of an internal circuit in a nonvolatile manner by using fuse elements.

2. Description of the Related Art

Several techniques are known for implementing a storage circuit which stores data in a nonvolatile manner in a semiconductor device. For example, when a large storage capacity is necessary, and repeated rewrites are required, a flash memory having memory cells with a stacked gate structure is formed. In this case, a special process different from a standard CMOS process is necessary. For, e.g., a memory LSI which mainly stores data in a nonvolatile manner, the cost overhead for the use of the special process can be suppressed by increasing the capacity.

In a system LSI or the like, however, the cost overhead increases when the dedicated process is used only to store small-capacity data such as security data, code data, ID data unique to a chip, or trimming data in a nonvolatile manner. In addition, the number of rewrites need not be 100,000, unlike a flash memory, although it depends on the application purpose. If semi-permanent data which may be written as needed should be stored in a nonvolatile manner, the number of rewrites needs to be only several times. It is not sensible to use the expensive flash process to guarantee 100,000 rewrites for such an application purpose. In this case, it is preferable to use a nonvolatile memory element which can be formed by the standard CMOS process.

As a nonvolatile memory element which can be implemented by the standard CMOS process, a fuse element is widely known (e.g., Jpn Pat. Appln. KOKAI Publication Nos. 2002-76126 and 2002-368096). As a fuse element, generally, a type whereby data is programmed by means of a laser beam or a type (electrical-fuse or e-fuse) whereby data is electrically programmed is used.

The former uses a metal or polysilicon interconnection as a fuse element. Programming is carried out by fusing the interconnection by irradiating it with a laser beam.

Conversely, the latter uses, e.g., an oxide film serving as an insulating member as a fuse element. To program data, high-voltage stress is applied to destroy the oxide film and cause the fuse element to conduct. That is, data is stored in accordance with the connection/disconnection of the oxide film. Alternatively, a polysilicon interconnection having a silicide layer formed on its surface by a salicide process is used as a fuse element. A high voltage is applied to supply a current to the silicide layer and destroy it. Accordingly, the resistance greatly increases. Data is stored in accordance with the change in resistance.

The fuse element whereby data is programmed by means of a laser beam must be programmed in a wafer state. However, the fuse element whereby data is electrically programmed can be programmed even after it is packaged or assembled in a system. Hence, code data or ID data unique to a chip can be programmed in the wafer state. In addition, even after assembly, the user can program security data or trimming data for timing adjustment or voltage regulation.

FIG. 1 is a block diagram showing the arrangement of a conventional storage circuit which uses the above-described electrically programmable fuse element. This storage circuit comprises a "1+n"-bit write data latch group 11, a "1+n"-bit fuse circuit group 12, and a "1+n"-bit read data latch group 13. One bit of each of the write data latch group 11, fuse circuit group 12, and read data latch group 13 stores an activation signal (enable bit data) En which represents activation of the storage circuit. The remaining n bits store data D1, D2, . . . , Dn such as code data, ID data unique to the chip, security data, and trimming data.

The data D1, D2, . . . , Dn to be stored in the fuse circuit group 12 is externally input as input signals Din1, Din2, . . . , Dinn or generated by an internal circuit in the semiconductor device and latched by the write data latch group 11. In accordance with the data D1, D2, . . . , Dn latched by the write data latch group 11, a high voltage is selectively applied across each fuse element in the fuse circuit group 12. Accordingly, data is selectively written in accordance with the destruction/nondestruction state of each fuse element.

To use the data stored in the fuse circuit group 12, the data must be converted into digital signals. To do this, when, e.g., the storage circuit is powered on, the data is read out in an analog manner in accordance with the destruction/nondestruction state of each fuse element in the fuse circuit group 12.

The results are latched by the read data latch group 13 prepared for the fuse elements. With this operation, while the storage circuit is powered on, the nonvolatile fuse data can be used as a digital signal latched by the read data latch group 13. This data is output onto a fuse data bus 14 and controls the internal circuits or is output to an external device.

FIG. 2 is a circuit diagram showing detailed arrangements of a write data latch 11i, fuse circuit 12i, and read data latch 13i corresponding to the ith bit (i=1, 2, . . . , n) in the circuit shown in FIG. 1. The write data latch 11i includes clocked inverters 20 and 21, an inverter 22, a NOR gate 23, and a MOSFET 24. Input data Dini corresponding to the ith bit is supplied to the input terminal of the clocked inverter 20. The input terminal of the clocked inverter 21 and the output terminal of the inverter 22 are connected to the output terminal of the clocked inverter 20. The input terminal of the inverter 22 and one input terminal of the NOR gate 23 are connected to the output terminal of the clocked inverter 21. A program signal /PROGRAM is supplied to the other input terminal of the NOR gate 23. The output terminal of the NOR gate 23 is connected to the gate of the MOSFET 24. One end of the current path of the MOSFET 24 is connected to the fuse circuit 12i. The other end of the current path is connected to a ground point Vss.

The fuse circuit 12i includes a fuse element 25 and a MOSFET 26. One terminal of the fuse element 25 is connected to a high-voltage power supply Vpp. The other terminal of the fuse element 25 is connected to one end of the current path of the MOSFET 26. The other end of the current path of the MOSFET 26 is connected to one end of the current path of the MOSFET 24.

The read data latch 13i includes MOSFETs 27 and 28, clocked inverters 29 and 30, and inverters 31, 32, and 33. The one end of the current path of the MOSFET 27 is connected to one end of the current path of the MOSFET 26. The other end of the current path of the MOSFET 27 is connected to one end of the current path of the MOSFET 28. The gate of the MOSFET 27 is connected to a power supply Vcc. The other end of the current path of the MOSFET 28 is connected to the ground point Vss. A reset signal RESET is supplied to the gate of the MOSFET 28. The input terminal of the clocked inverter 29 is connected to the connection point between the current paths of the MOSFETs 27 and 28. The input terminal of the clocked inverter 30 and the output terminal of the inverter 31 are connected to the output terminal of the clocked inverter 29. The input terminals of the inverters 31 and 32 are connected to the output terminal of the clocked inverter 30. The input terminal of the inverter 33 is connected to the output terminal of the inverter 32. Read data Douti is obtained from the output terminal of the inverter 33.

In the above arrangement, data programming is done in the following way. In the example to be described below, the fuse element 25 is of an insulating film destruction type which destroys an insulating film to set a conductive state. When the input data Dini is set to the "L" level, and the program signal /PROGRAM is set to the "L" level, the output from the NOR gate 23 changes to the "H" level. In this state, a selection signal SELECT is set to the "H" level. Accordingly, the MOSFETs 24 and 26 are turned on to supply a current from the high-voltage power supply Vpp to the ground point Vss through the fuse element 25 and the current paths of the MOSFETs 26 and 24. Then, the insulating film of the fuse element 25 is destroyed to render the fuse element 25 conductive.

The conductive state of the fuse element 25 is latched by the read data latch 13i as stored data. More specifically, when the reset signal RESET temporarily changes to the "H" level, the MOSFET 28 is turned on. The input terminal of the clocked inverter 29 is discharged and set to the "L" level. Accordingly, the output from the clocked inverter 29 changes to the "H" level. This state is latched by the clocked inverters 29 and 30 and inverter 31 and set as an initial state. When the fuse element 25 is being rendered conductive, and the reset signal RESET returns to the "L" level, the input terminal of the clocked inverter 29 is charged from the high-voltage power supply Vpp through the current path of the MOSFET 27 and set to the "H" level. The output from the clocked inverter 29 changes to the "L" level. This state is latched by the clocked inverters 29 and 30 and inverter 31. When the fuse element 25 is not being rendered conductive, the initial state is maintained.

The fuse element 25 stores data by using an irreversible destruction phenomenon in an oxide film or electrode material regardless of whether the fuse element is of an insulating film destruction type which destroys, e.g., an oxide film, or a conductive film destruction type which destroys, e.g., a silicide layer. For this reason, once the fuse element is programmed, it cannot be returned to the nondestruction state as before. Hence, a rewrite cannot be executed at all, although it is very advantageous that a nonvolatile storage circuit can be formed by using the standard CMOS process.

BRIEF SUMMARY OF THE INVENTION

According to an aspect of the invention there is provided a semiconductor device comprising a first fuse circuit group which is electrically programmable and in which n-bit data is written, and a plurality of second fuse circuit groups each having a first storage unit which is electrically programmable and stores m-bit (m is an integral submultiple of n) rewrite data, and a second storage unit which stores an address of a bit to be written in the first fuse circuit group.

According to another aspect of the invention there is provided a semiconductor device comprising a plurality of electrically programmable fuse circuit groups in each of which an address is written, wherein a fuse circuit group to be read-accessed is selected on the basis of the addresses written in the plurality of fuse circuit groups.

According to still another aspect of the invention there is provided a semiconductor device comprising a plurality of fuse blocks which are electrically programmable and substantially have the same number of bits, each of the plurality of fuse blocks having a first fuse circuit which stores an activation signal, a second fuse circuit which stores data, and a third fuse circuit which stores an address, wherein an activated fuse block of the plurality of fuse blocks is selected on the basis of the activation signal stored in the first fuse circuit, and data is written in the second fuse circuit of the activated fuse block, and a fuse block whose second fuse circuit should output data is selected in accordance with a decode signal generated on the basis of the address stored in the third fuse circuit.

DETAILED DESCRIPTION OF THE INVENTION

First Embodiment

Figure 3:
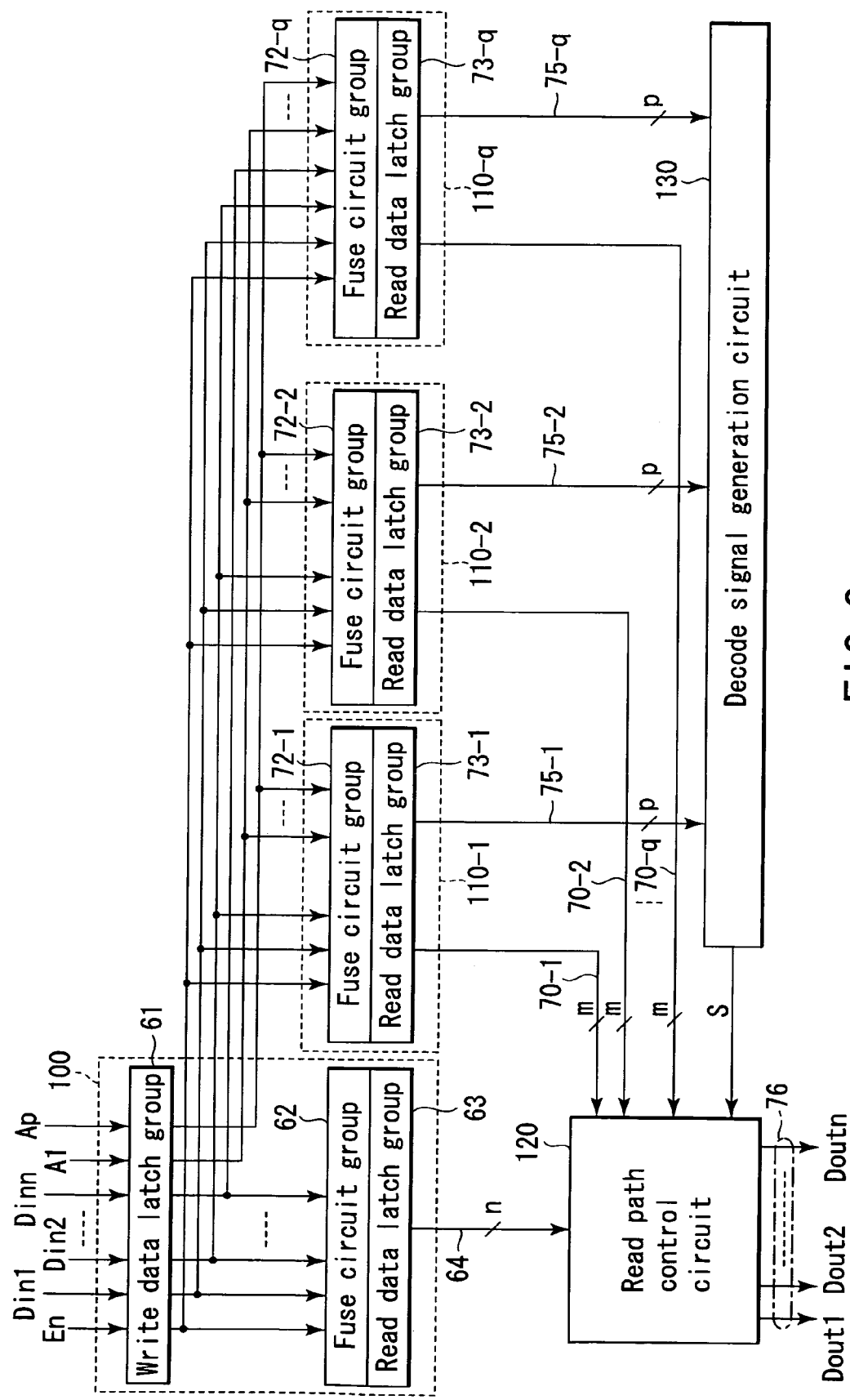
FIG. 3 is a block diagram showing the schematic arrangement of a storage circuit which stores data in a nonvolatile manner by using fuse elements so as to explain a semiconductor device according to the first embodiment of the present invention.
Figure 4A:
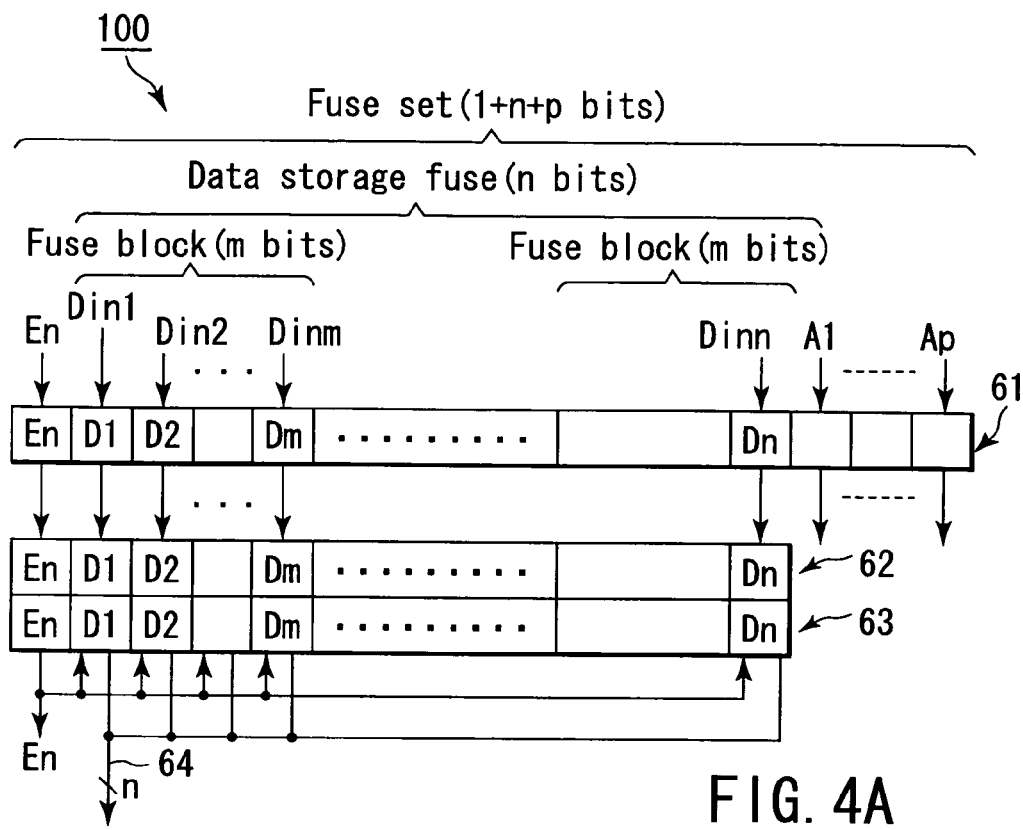
FIG. 4A is a block diagram showing the arrangement of the storage circuit shown in FIG. 3 and, more specifically, an initial write fuse set.
Figure 4B:
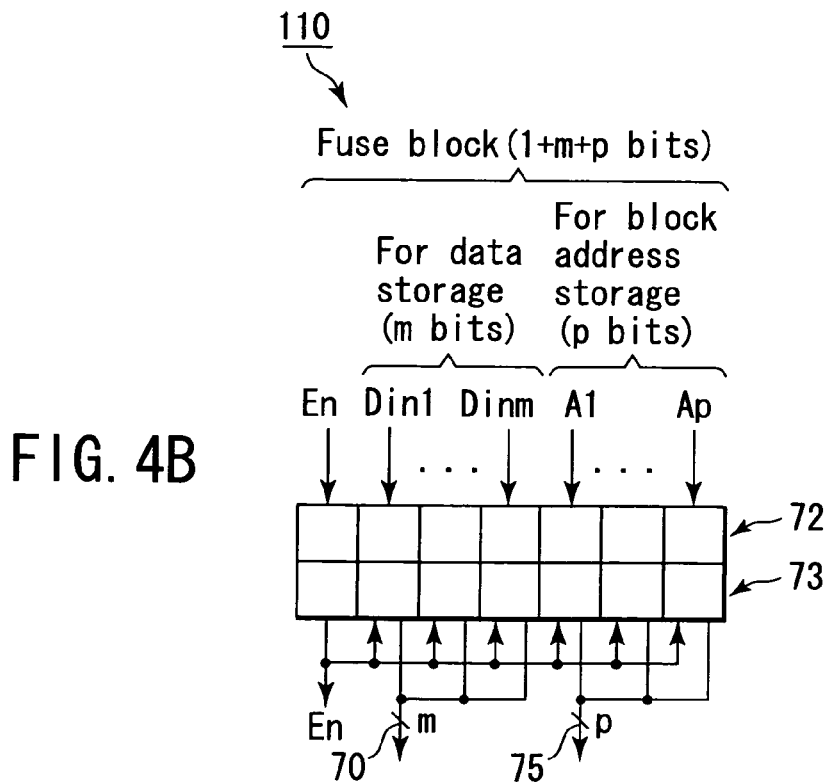
FIG. 4B is a block diagram showing the arrangement of the storage circuit shown in FIG. 3 and, more specifically, a rewrite fuse block.

FIG. 3 is a block diagram showing the schematic arrangement of a storage circuit which stores data in a nonvolatile manner by using fuse elements so as to explain a semiconductor device according to the first embodiment of the present invention. FIGS. 4A and 4B are block diagrams showing the arrangements of an initial write fuse set and a rewrite fuse block in the storage circuit shown in FIG. 3, respectively.

The storage circuit shown in FIG. 3 comprises an electrically programmable initial write fuse set 100 and q electrically programmable rewrite fuse blocks 110-1, 110-2, . . . , 110-q. The fuse set 100 has a write data latch group 61, a fuse circuit group 62, and a read data latch group 63. The fuse blocks 110-1, 110-2, . . . , 110-q have fuse circuit groups 72-1, 72-2, . . . , 72-q and read data latch groups 73-1, 73-2, . . . , 73-q, respectively.

In the initial write fuse set 100, the write data latch group 61 has a "1+n+p"-bit structure, and each of the fuse circuit group 62 and read data latch group 63 has a "1+n"-bit structure, as shown in FIG. 4A. Each of the fuse circuit group 62 and read data latch group 63 has one bit which stores an activation signal (enable bit data) En and n bits (for data storage) which store data D1, D2, . . . , Dn such as code data, ID data unique to the chip, security data, and trimming data. The write data latch group 61 has p bits which receive block addresses A1 to Ap in addition to the "1+n" bits. The n bits for data storage in each of the write data latch group 61, fuse circuit group 62, and read data latch group 63 are divided into an integral submultiple and, for example, 1/k. One unit forms an m-bit fuse block. A data rewrite is executed for each fuse block, i.e., every m bits. Which m-bit fuse block should be rewritten in the k fuse blocks is designated by the block addresses A1 to Ap.

On the other hand, each of the rewrite fuse blocks 110-1, 110-2, . . . , 110-q has the fuse circuit group 72 and read data latch group 73, as shown in FIG. 4B. each of the fuse circuit group 72 and read data latch group 73 has a "1+m+p"-bit structure comprising one bit (third storage unit) which stores the activation signal En, m bits (first storage unit) for data storage, and p ($=\log_2 k$) bits (second storage unit) for block address storage, which stores addresses to designate an m-bit fuse block which should be rewritten in the k fuse blocks of the initial write fuse set.

In a data rewrite mode, the fuse blocks 110-1, 110-2, . . . , 110-q selectively receive enable bit data, m-bit rewrite data, and their addresses from the write data latch group 61 in accordance with the to-be-rewritten bits of the data D1, D2, . . . , Dn, their addresses, and the number of times of rewrites.

The n-bit data read out from the fuse set 100 is supplied to a read path control circuit 120 through a fuse data bus 64. M-bit data read out from each of the fuse blocks 110-1, 110-2, . . . , 110-q is supplied to the read path control circuit 120 through a fuse data bus 70 (70-1, 70-2, . . . , 70-q). When part of the initial write fuse set 100 is to be rewritten, the read path control circuit 120 serves as a selection circuit which effects control to replace only the corresponding part with fuse data that is rewritten later. When the rewritten part is rewritten again, the read path control circuit 120 effects control such that the latest written data is read out. The read path control circuit 120 is controlled by receiving a decode signal S from a decode signal generation circuit 130. The decode signal generation circuit 130 generates the decode signal S by decoding addresses (addresses to designate m bits that should be rewritten in the initial write fuse set 100) read out from the fuse circuit groups 72-1, 72-2, . . . , 72-q in the fuse blocks 110-1, 110-2, . . . , 110-q through the read data latch groups 73-1, 73-2, . . . , 73-q and fuse address buses 75-1, 75-2, . . . , 75-q. The read path control circuit 120 outputs output data Dout1, Dout2, . . . , Doutn through fuse data output buses 76.

Figure 5:
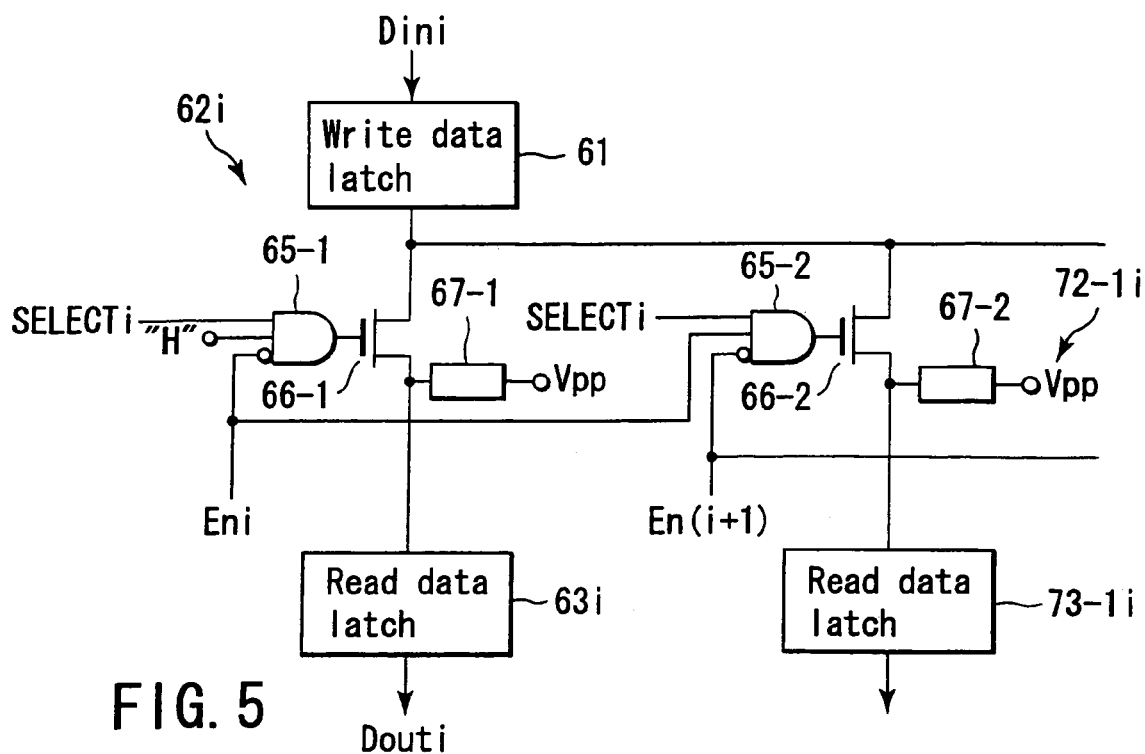
FIG. 5 is a circuit diagram showing a detailed arrangement of part of a fuse circuit group so as to explain detailed arrangements of the fuse set and fuse block shown in FIGS. 4A and 4B.

FIG. 5 is a circuit diagram showing detailed arrangements of circuits 62$i$ and 72-1$i$ corresponding to the ith bits of the fuse circuit groups 62 and 72-1 so as to explain detailed arrangements of the fuse set 100 and fuse blocks 110-1, 110-2, . . . , 110-q shown in FIGS. 4A and 4B.

This circuit includes AND gates 65-1, 65-2, . . . , MOSFETs 66-1, 66-2, . . . serving as program switches, and fuse elements 67-1, 67-2, . . . . A selection signal SELECTi is supplied to the first input terminal of the AND gate 65-1. The second input terminal of the AND gate 65-1 is fixed to "H" level. An inverted signal of an activation signal Eni is supplied to the third input terminal of the AND gate 65-1. The output terminal of the AND gate 65-1 is connected to the gate of the MOSFET 66-1. One end of the current path of the MOSFET 66-1 is connected to a write data latch 61$i$. The other end of the current path is connected to a read data latch 63$i$. One terminal of the fuse element 67-1 is connected to a high-voltage power supply Vpp. The other terminal of the fuse element 67-1 is connected to the other end of the current path of the MOSFET 66-1.

The selection signal SELECTi is supplied to the first input terminal of the AND gate 65-2. The activation signal Eni is supplied to the second input terminal of the AND gate 65-2. An inverted signal of the activation signal En (i+1) is supplied to the third input terminal of the AND gate 65-2. The output terminal of the AND gate 65-2 is connected to the gate of the MOSFET 66-2. One end of the current path of the MOSFET 66-2 is connected to the write data latch 61$i$. The other end of the current path is connected to a read data latch 73-1$i$. One terminal of the fuse element 67-2 is connected to the high-voltage power supply Vpp. The other terminal of the fuse element 67-2 is connected to the other end of the current path of the MOSFET 66-2.

An output signal Douti from the read data latch 63$i$ and the output signal from the read data latch 73-1$i$ are supplied to the read path control circuit 120 so that the selection operation is performed.

Figure 6:
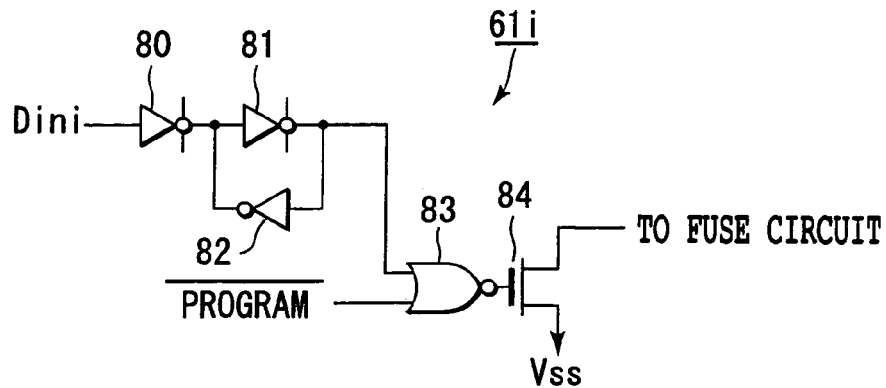
FIG. 6 is a circuit diagram showing a detailed arrangement of part of the write data latch in the circuits shown in FIGS. 3, 4A, 4B, and 5.
Figure 7:
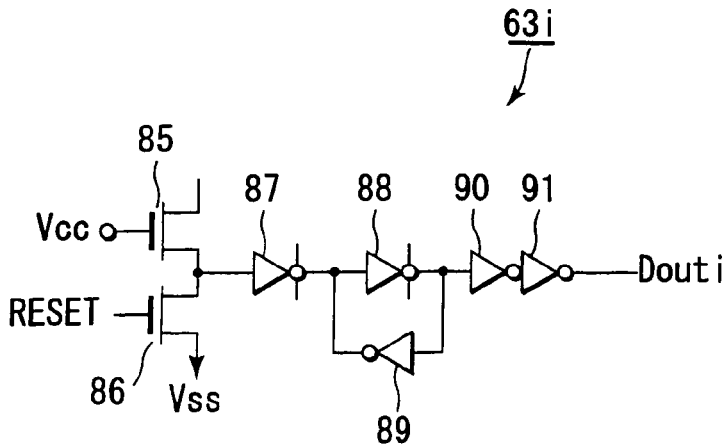
FIG. 7 is a circuit diagram showing a detailed arrangement of part of the read data latch in the circuits shown in FIGS. 3, 4A, 4B, and 5.

FIGS. 6 and 7 are circuit diagrams showing detailed arrangements of the write data latch 61 and read data latch 63, 73-1, 73-2, . . . , 73-q corresponding to the ith bits in the circuits shown in FIGS. 3, 4A, 4B, and 5. As shown in FIG. 6, the write data latch 61$i$ includes clocked inverters 80 and 81, an inverter 82, a NOR gate 83, and a MOSFET 84. The input data Dini is supplied to the input terminal of the clocked inverter 80. The input terminal of the clocked inverter 81 and the output terminal of the inverter 82 are connected to the output terminal of the clocked inverter 80.

The input terminal of the inverter 82 and one input terminal of the NOR gate 83 are connected to the output terminal of the clocked inverter 81. A program signal /PROGRAM is supplied to the other input terminal of the NOR gate 83. The output terminal of the NOR gate 83 is connected to the gate of the MOSFET 84. One end of the current path of the MOSFET 84 is connected to the fuse circuit. The other end of the current path is connected to a ground point Vss.

The read data latch 63i (73-1i, 73-2i, ..., 73-qi) includes MOSFETs 85 and 86, clocked inverters 87 and 88, and inverters 89, 90, and 91, as shown in FIG. 7. The one end of the current path of the MOSFET 85 is connected to the fuse circuit. The other end of the current path of the MOSFET 85 is connected to one end of the current path of the MOSFET 86. The gate of the MOSFET 85 is connected to a power supply Vcc. The other end of the current path of the MOSFET 86 is connected to the ground point Vss. A reset signal RESET is supplied to the gate of the MOSFET 86. The input terminal of the clocked inverter 87 is connected to the connection point between the current paths of the MOSFETs 85 and 86. The input terminal of the clocked inverter 88 and the output terminal of the inverter 89 are connected to the output terminal of the clocked inverter 87. The input terminals of the inverters 89 and 90 are connected to the output terminal of the clocked inverter 88. The input terminal of the inverter 91 is connected to the output terminal of the inverter 90. The output data Douti is obtained from the output terminal of the inverter 91.

The write data latches and read data latches for the remaining bits also basically have the same arrangements as those shown in FIGS. 6 and 7.

Figure 8:
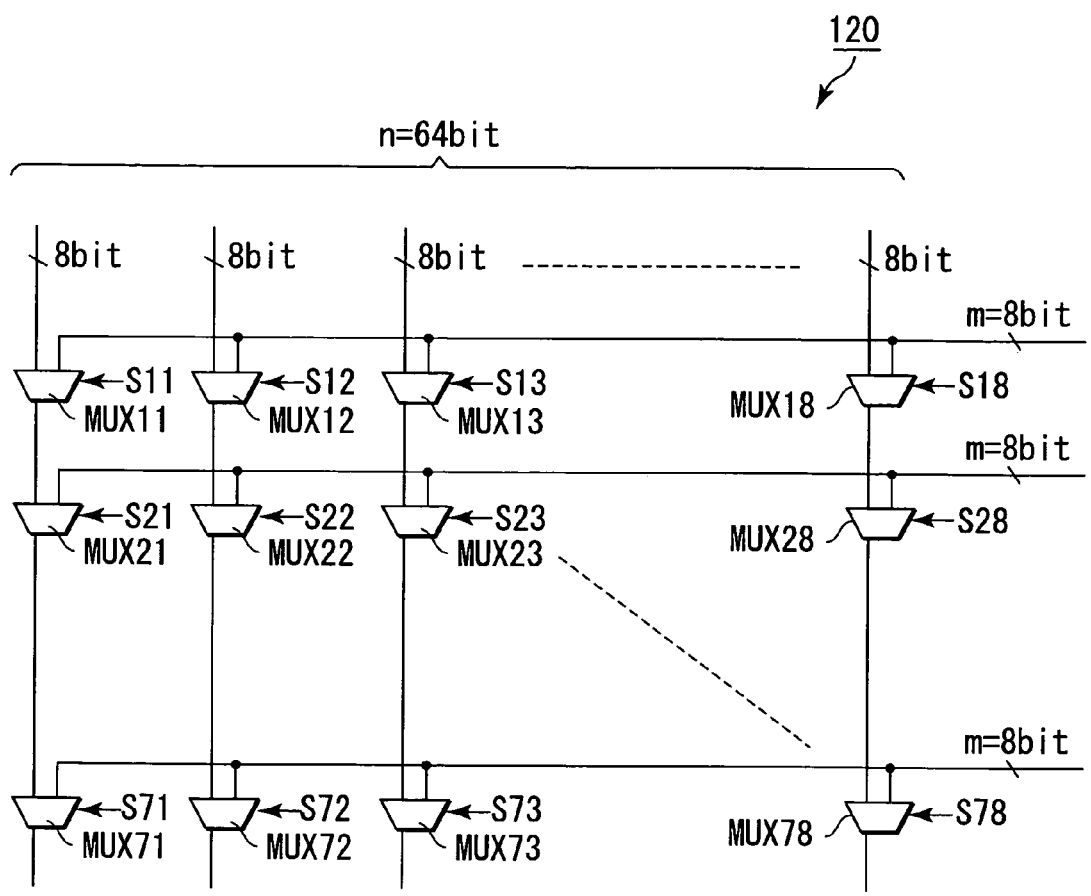
FIG. 8 is a block diagram showing a detailed arrangement of a read path control circuit in the circuit shown in FIG. 3.

FIG. 8 shows a detailed arrangement of the read path control circuit 120 in the circuit shown in FIG. 3. In the example of the circuit shown in FIG. 8, the fuse set 100 has a bit structure of n=64, m=8, and k=8. Multiplexers MUX11 to MUX78 are arranged in an array. The multiplexers MUX11 to MUX78 are controlled by the decode signal S (S11 to S78) output from the decode signal generation circuit 130. The multiplexers MUX11 to MUX18 are used to control fuse blocks to be used for the first rewrite. The multiplexers MUX21 to MUX28 are used to control fuse blocks to be used for the second rewrite. The multiplexers MUX71 to MUX78 are used to control fuse blocks to be used for the seventh rewrite. That is, the data rewrite can be executed seven times.

In a state wherein data is written in the initial write fuse set 100, 8-bit data is supplied from each of eight parts of the fuse circuit group 62 to one input terminal of a corresponding one of the multiplexers MUX11 to MUX18 through the fuse data bus 64. That is, 64-bit data are supplied in total. Eight-bit data is supplied from the read data latch group 73-1 of the first stage to the other input terminal of each of the multiplexers MUX11 to MUX18 through the fuse data bus 70-1. When no rewrite has been performed yet, the 64-bit data output from the fuse set 100 is selected under the control of the decode signals S11 to S18. When the first rewrite has been performed, instead of part (8-bit data) of the 64-bit data read out from the fuse set 100, the 8-bit data read out from the read data latch group 73-1 of the first stage is selected by the multiplexers MUX11 to MUX18 under the control of the decode signals S11 to S18. At this time, the multiplexers MUX21 to MUX78 select the outputs from the multiplexers MUX11 to MUX18 of the first stage under the control of the decode signals S21 to S78.

When the rewrite (second rewrite) is executed again, the 8-bit data output from each of the multiplexers MUX11 to MUX18 is supplied to the input terminal of a corresponding one of the multiplexers MUX21 to MUX28 (64-bit data are supplied in total). The 8-bit data read out from the read data latch group 73-2 of the second stage through the fuse data bus 70-2 is selected by the multiplexers MUX21 to MUX28.

As described above, the read path control circuit 120 effects control to select m-bit data read out from the initial write fuse set 100 or select the data read out from the rewrite fuse blocks 110-1, 110-2, ..., 110-q. The read path control circuit 120 can cope with rewrites of seven times by repeating the same operation.

Figure 9:
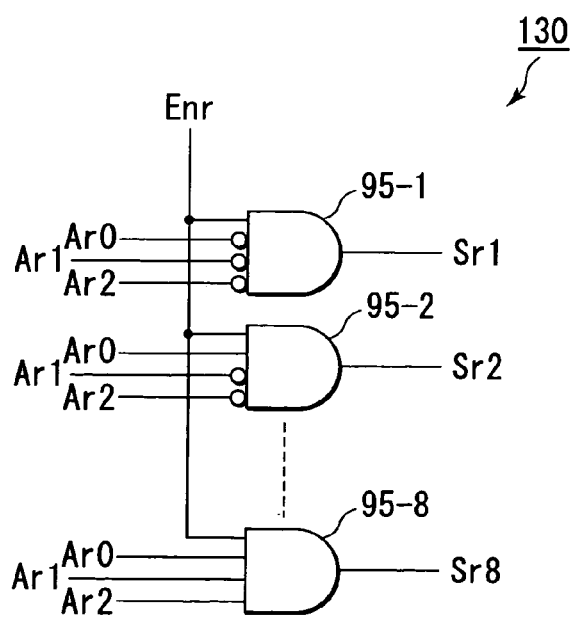
FIG. 9 is a circuit diagram showing a detailed arrangement of a decode signal generation circuit in the circuit shown in FIG. 3.

FIG. 9 shows a logic arrangement when the rewrite can be executed three times (p=3) so as to explain the arrangement of the decode signal generation circuit 130 which supplies the decode signals S11 to S78 to the multiplexers MUX11 to MUX78 in the read path control circuit 120 shown in FIG. 8. The decode signal generation circuit 130 includes 4-input AND gates 95-1, 95-2, ..., 95-8. An activation signal Enr for r (r=1 to 3) rewrite fuse blocks is supplied to the first input terminal of each of the AND gates 95-1, 95-2, ..., 95-8. Address signals Ar0, Ar1, and Ar2 and inverted signals /Ar0, /Ar1, and /Ar2 thereof are selectively supplied to the second to fourth input terminals of the AND gates 95-1, 95-2, ..., 95-8. Decode signals Sr1, Sr2, ..., Sr8 are output from the output terminals of the AND gates 95-1, 95-2, ..., 95-8 to the read path control circuit 120.

Figure 1:
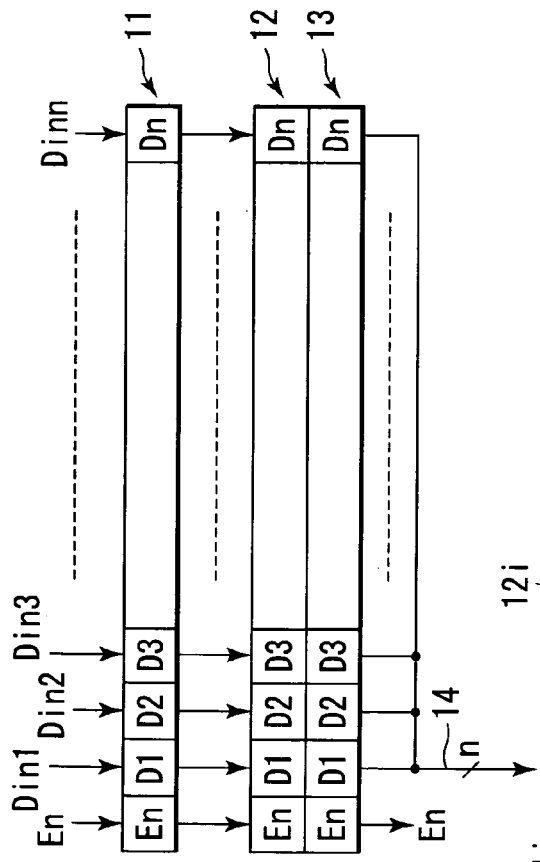
FIG. 1 is a block diagram showing the arrangement of a conventional storage circuit which uses electrically programmable fuse elements.
Figure 2:
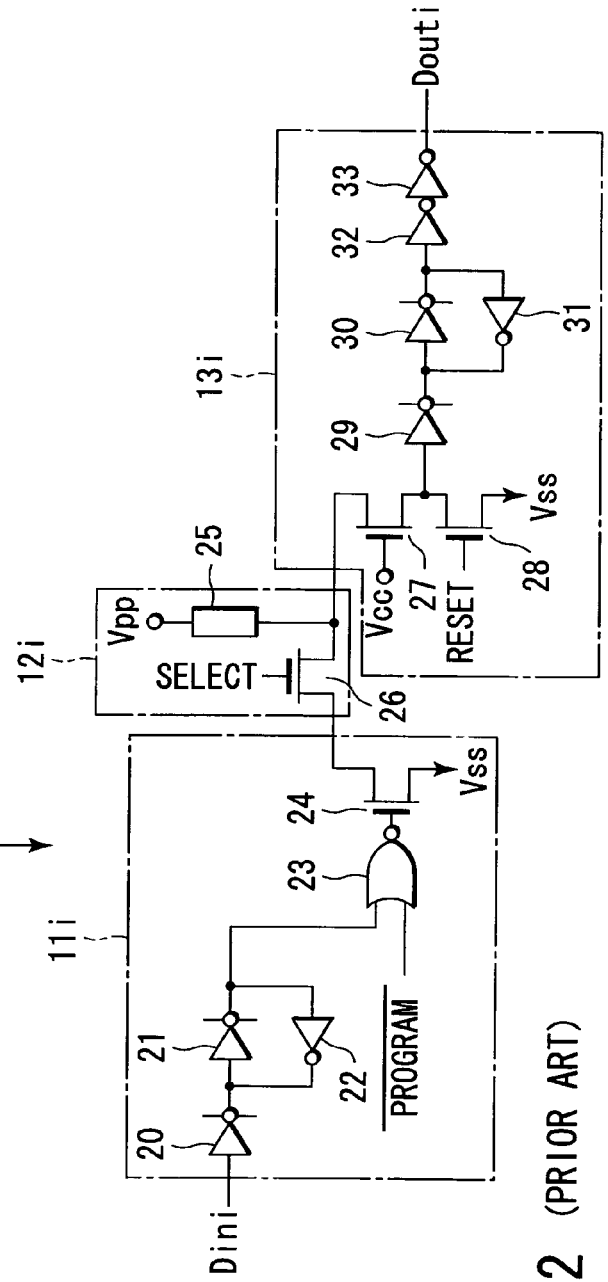
FIG. 2 is a circuit diagram showing detailed arrangements of a write data latch, fuse circuit, and read data latch corresponding to the ith bit in the circuit shown in FIG. 1.

The operation of the above-described arrangement will be described next. In the arrangements shown in FIGS. 3 to 9, the write and read operations for the fuse elements 67-1, 67-2, ... are basically the same as those of the above-described circuits shown in FIGS. 1 and 2 except the fuse element selection operation.

In the initial write, n-bit data is written in the fuse set 100. Data is also written in one bit for activation. When the data is written in one bit for activation, the next write path is switched to the first block (fuse block 110-1) of the rewrite fuse blocks. More specifically, in the initial write, the activation signal En and the data D1, D2, ..., Dn to be stored in the fuse circuit group 62 are supplied and latched to the write data latch group 61. The data D1, D2, ..., Dn are externally input as input signals Din1, Din2, ..., Dinn or generated by an internal circuit and supplied to the write data latch group 61. In accordance with the data D1, D2, ..., Dn latched by the write data latch group 61, a high voltage is selectively applied across each fuse element in the fuse circuit group 62. Accordingly, data is selectively written in accordance with the destruction/nondestruction state of each fuse element.

In a data rewrite, the p-bit block addresses A1 to Ap that designate which m-bit fuse block should be rewritten in the k fuse blocks are supplied to the write data latch group 61. The address data and enable bit data are simultaneously written in the fuse block 110-1.

In the above-described example for n=64, m=8, and k=8, p=3. That is, 64-bit data is divided into eight parts, and the rewrite is executed for every eight bits. When the number of times of rewrites is seven, seven 8-bit rewrite fuse blocks suffice. The number of fuse elements is 64+1=65 bits for the initial write and 1 (En)+3 (address)+8 (data)=12 bits, and in total, 65+12×7=149.

The read from the fuse elements will be examined next. When part of the initial write fuse set has been rewritten, only that part must be replaced with fuse data rewritten later. When the rewrite has been executed repeatedly for the same address, data that has lastly been written must be read out. This selection operation is implemented by the read path control circuit (selection circuit) 120 shown in FIG. 8.

The same conditions as described above, n=64, m=8, and k=8, are set. When data has been written in the initial write fuse set, 8-bit data output from each of the eight fuse element groups is transferred to the fuse data bus 64. The multiplexers MUX11 to MUX78 are arranged such that the signals from the seven rewrite fuse sets can be switched for the 8-bit bus. Assume that data is written in the rewrite fuse block 110-1 of the first stage. Data is written in the enable bit En in the rewrite fuse block, and the selection operation by the multiplexers is switched by the decode signals S11 to S78 generated by the decode signal generation circuit 130 on the basis of the addresses written in that fuse block. When data read out from the rewrite fuse block is selected by one multiplexer, switching is executed such that the 8-bit data read out from the rewrite fuse block is transferred to the fuse data output bus 76 instead of 8-bit data of the 64-bit data read out from the initial write fuse set. For every addresses that select a fuse circuit group, the data of fuse circuit group which is latest write-accessed is transferred to the fuse data bus 64, thereby obtaining the read data Dout1, Dout2, . . . , Doutn.

According to the above arrangement, a rewritable nonvolatile storage circuit can be implemented by the standard CMOS process. The special process to form a nonvolatile memory element such as a stacked gate is unnecessary. In addition, part of data in the fuse set can be rewritten. For these reasons, the cost can be reduced by decreasing the number of fuse elements used.

Hence, a semiconductor device having a fuse circuit can be obtained, which can more efficiently use fuse elements by making part of data in the fuse set rewritable in a rewrite mode for a unit less than the number of bits of the fuse set.

Second Embodiment

Figure 10A:
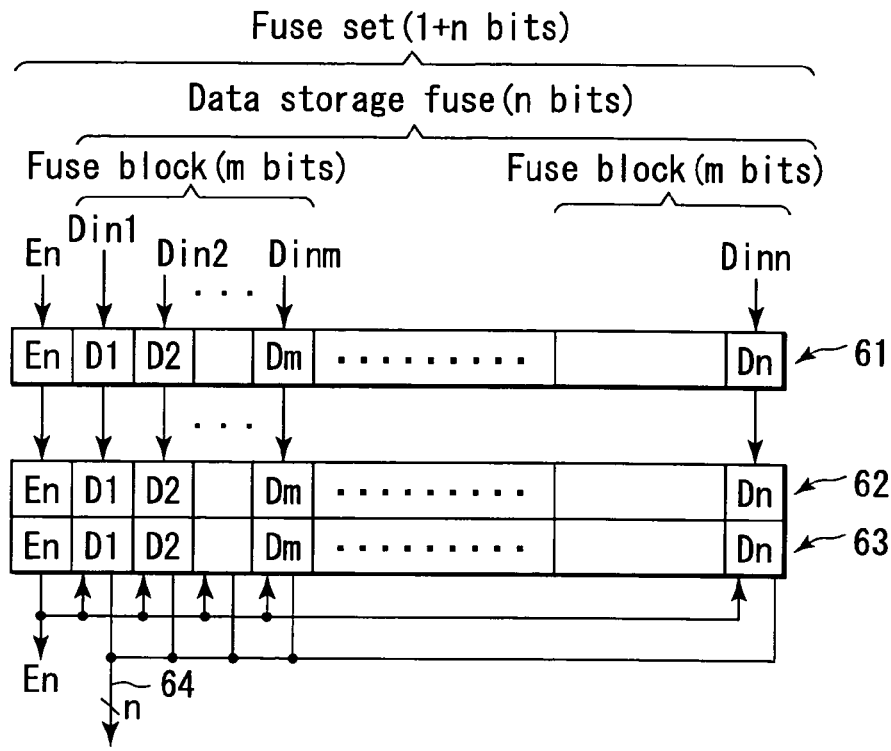
FIG. 10A is a block diagram showing the schematic arrangement of an initial write fuse set in a storage circuit which stores data in a nonvolatile manner by using fuse elements so as to explain a semiconductor device according to the second embodiment of the present invention.
Figure 10B:
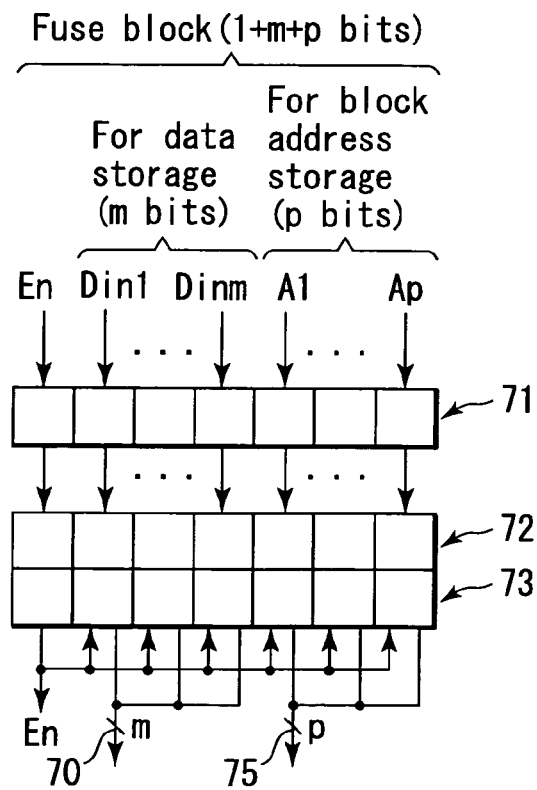
FIG. 10B is a block diagram showing the schematic arrangement of a rewrite fuse block in the storage circuit which stores data in a nonvolatile manner by using fuse elements so as to explain the semiconductor device according to the second embodiment of the present invention.

FIGS. 10A and 10B are block diagrams showing the schematic arrangement of a storage circuit which stores data in a nonvolatile manner by using fuse elements so as to explain a semiconductor device according to the second embodiment of the present invention. FIG. 10A shows an initial write fuse set. FIG. 10B shows a rewrite fuse block.

In the semiconductor device according to the second embodiment, as shown in FIG. 10A, the initial write fuse set has a "1+n"-bit structure comprising a write data latch group 61, a fuse circuit group 62, and a read data latch group 63. This fuse set has one bit which stores an activation signal (enable bit data) En and n bits (for data storage) which store data D1, D2, . . . , Dn. The n bits for data storage in each of the write data latch group 61, fuse circuit group 62, and read data latch group 63 are divided into an integral submultiple and, for example, 1/k. One unit forms an m-bit fuse block. A data rewrite is executed for each fuse block, i.e., every m bits.

On the other hand, the rewrite fuse block has a write data latch group 71, a fuse circuit group 72, and a read data latch group 73 each having a "1+m+p"-bit structure, as shown in FIG. 10B. This fuse block has one bit which stores the activation signal En, m bits for data storage, and p ($=\log_2 k$) bits for block address storage, which store addresses to designate an m-bit fuse block which should be rewritten in the k fuse blocks of the initial write fuse set.

The number of rewrite fuse blocks shown in FIG. 10B corresponds to the number of times of rewrites.

As described above, even when each of the initial write fuse set and rewrite fuse block has a write data latch group, an operation which is basically the same as in the above-described first embodiment can be performed, and the same functions and effects as in the first embodiment can be obtained.

Third Embodiment

In the above-described first and second embodiments, the initial write fuse set has a total bit length (64 bits in the example). The rewrite fuse block has a bit length (eight bits) obtained by dividing the total bit length by k.

In the third embodiment, the initial write fuse set also has the same structure as that of the rewrite fuse block. For example, k m-bit fuse blocks shown in FIG. 10B are prepared, and an arbitrary number of fuse blocks are selected for the write. When each fuse block has p address bits, $2^P$ addresses can be selected at maximum. When $m \times 2^P$ fuse data buses are prepared, fuse data of an arbitrary number of bits up to the maximum length, i.e., the bit length corresponding to the number of the fuse data buses can be stored.

For bits to be rewritten, data is written for a new fuse set together with addresses for every m bits. At this time, switch control is executed by the activation signal (enable bit data) En of each fuse block, as in FIG. 10B, thereby sequentially writing data in unused fuse blocks.

For a read, when the same selection circuit (read path control circuit) as that shown in FIG. 8 is prepared, latest write data can be transferred to the fuse data bus for each address.

As described above, in implementing a rewritable fuse set by preparing redundant sets of fuse elements, when the rewrite unit is made smaller relative to the total bit length, the number of fuse elements necessary for rewriting part of data can be reduced. In the example described in the first embodiment, the number of fuse elements can be decreased from 520 in the prior art to 149, i.e., ⅓ or less. Since a fuse element must have an additional circuit such as a latch circuit, the area per fuse element is considerably large. The area reduction effect that is obtained by decreasing the number of fuse elements and their additional circuits such as latch circuits outweighs the increase in pattern occupation area due to addition of the read path control circuit and decode signal generation circuit shown in FIGS. 8 and 9. This leads to a decrease in chip occupation area.

Hence, even in the above arrangement, a rewritable nonvolatile storage circuit can be implemented by the standard CMOS process. The special process to form a nonvolatile memory element such as a stacked gate is unnecessary. In addition, part of data in the fuse set can be rewritten. For these reasons, the cost can be reduced by decreasing the number of fuse elements used.

As described above, according to one aspect of the present invention, a semiconductor device having a fuse circuit capable of rewriting data while storing data by using fuse elements can be obtained. Furthermore, in a rewrite mode for a unit less than the number of bits of the fuse set, part of data in the fuse set is rewritable so that the fuse elements can more efficiently be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first fuse circuit group which is electrically programmable and in which n-bit data is written; and
   a plurality of second fuse circuit groups each having a first storage unit which is electrically programmable and stores m-bit (m is an integral submultiple of n) rewrite data, and a second storage unit which stores an address of a bit to be written in the first fuse circuit group.

2. A device according to claim 1, wherein in rewriting the data written in the first fuse circuit group, data to be rewritten is written in the first storage unit of the second fuse circuit group, the address of the bit to be written in the first fuse circuit group is written in the second storage unit, and a read of data at the address, which is written in the first fuse circuit group, is inhibited.

3. A device according to claim 2, wherein each of the first fuse circuit group and said plurality of second fuse circuit groups further comprises a third storage unit which stores an activation signal to control activation/deactivation, and
   the read of data at the address, which is written in the first fuse group, and a selection operation of said plurality of second fuse circuit groups are controlled in accordance with the data stored in the third storage unit.

4. A device according to claim 3, wherein when the activation signal is not written in the third storage unit of an ith second fuse circuit group of said plurality of second fuse circuit groups, and the activation signal is written in the third storage unit of an (i-1)th second fuse circuit group, write data can be written in the ith second fuse circuit group.

5. A device according to claim 4, which further comprises a write data latch group to which the activation signal, the n-bit data, and the address of the bit to be rewritten in the first fuse circuit group are input, and
   in which the activation signal and the n-bit data are supplied from the write data latch group to the first fuse circuit group, and
   the activation signal, m-bit data of the n-bit data, and the address of the bit to be written in the first fuse circuit group are supplied from the write data latch group to said plurality of second fuse circuit groups.

6. A device according to claim 4, which further comprises a first write data latch group which is arranged in correspondence with the first fuse circuit group and to which the activation signal and the n-bit data are input, and
   a plurality of second write data latch groups which are arranged in correspondence with said plurality of second fuse circuit groups and to which the activation signal, m-bit data, and the address of the bit to be written in the first fuse circuit group are input, and
   in which the activation signal and the n-bit data are supplied from the first write data latch group to the first fuse circuit group, and
   the activation signal, the m-bit data, and the address of the bit to be written in the first fuse circuit group are supplied from each of said plurality of second write data latch groups to a corresponding one of said plurality of second fuse circuit groups.

7. A device according to claim 5, further comprising
   a first read data latch group to which the activation signal and the n-bit data, which are read out from the first fuse circuit group, are input,
   a plurality of second read data latch groups which are arranged in correspondence with said plurality of second fuse circuit groups and to which the activation signal, the m-bit data, and the address, which are read out from said plurality of second fuse circuit groups, are input,
   a read path control circuit configured to receive n-bit first data read out from the first fuse circuit group and m-bit second data read out from said plurality of second fuse circuit groups, switch at least part of the n-bit first data read out from the first fuse circuit group to the m-bit second data read out from at least one second fuse circuit group selected from said plurality of second fuse circuit groups, and output n-bit data, and
   a decode signal generation circuit configured to decode the addresses latched by said plurality of second read data latch groups and control a read path switching operation by the read path control circuit.

8. A device according to claim 7, wherein the read path control circuit includes multiplexers which are arranged in an array and execute the selection operation in accordance with output signals from the decode signal generation circuit.

9. A device according to claim 7, wherein the read path control circuit comprises a first multiplexer group in which m-bit data of the n-bit data read out from the first read data latch group is input to each first input terminal, m-bit data read out from one of said plurality of second read data latch groups is supplied to each second input terminal, and one of the m-bit data is selected in accordance with an output signal from the decode signal generation circuit, and a second multiplexer group in which m-bit data of the n-bit data selected by the first multiplexer group is input to each first input terminal, m-bit data read out from one of said plurality of remaining second read data latch groups is supplied to each second input terminal, and one of the m-bit data is selected in accordance with an output signal from the decode signal generation circuit.

10. A device according to claim 9, wherein the decode signal generation circuit includes a plurality of AND gates to which the activation signal, the addresses latched by said plurality of second read data latch groups, and inverted signals of the addresses are selectively input, and which controls a selection operation of the first multiplexer group and the second multiplexer group.

11. A device according to claim 1, wherein each of the first fuse circuit group and said plurality of second fuse circuit groups includes an electrically programmable fuse element.

12. A semiconductor device comprising:
   a plurality of electrically programmable fuse circuit groups, each of said plurality of fuse circuit groups having a first storage unit which stores data, a second storage unit which stores addresses, and a third storage unit which stores an activation signal to control activation/deactivation;
   a plurality of write data latch groups, which are arranged in correspondence with said plurality of fuse circuit groups, and to which the activation signal, m-bit data, and the addresses are input; and
   a selection circuit configured to control a read operation and a read inhibition operation for the data from the first storage unit in said plurality of fuse circuit groups, in accordance with the activation signal stored in the third storage unit, wherein a fuse circuit group to be read-accessed is selected on a basis of the addresses written in said plurality of fuse circuit groups.

* * * * *